United States Patent [19]
Frasier et al.

[11] Patent Number: 5,312,584
[45] Date of Patent: May 17, 1994

[54] MOLDLESS/CORELESS SINGLE CRYSTAL CASTINGS OF NICKEL-ALUMINIDE

[75] Inventors: Donald J. Frasier, Greenwood; Ralph E. Peeler, Reelsville; John H. Lane; Heidi Mueller-Largent, both of Indianapolis, all of Ind.

[73] Assignee: General Motors Corporation, Detroit, Mich.

[21] Appl. No.: 838,155

[22] Filed: Feb. 18, 1992

[51] Int. Cl.$^5$ .............................................. B22F 7/02
[52] U.S. Cl. ................................... 419/47; 219/121.66; 219/121.64; 148/404
[58] Field of Search ............ 219/121 LF, 121.64, 219/121.63; 156/62.2; 118/641; 428/614; 419/47; 505/1

[56] References Cited

U.S. PATENT DOCUMENTS

| | | | |
|---|---|---|---|
| 4,323,756 | 4/1982 | Brown et al. | 219/121 |
| 4,863,538 | 9/1989 | Deckard | 156/62.2 |
| 5,038,014 | 8/1991 | Pratt et al. | 219/121.64 |
| 5,116,438 | 5/1992 | Darolia et al. | 148/404 |
| 5,204,055 | 4/1993 | Sachs et al. | 419/2 |

OTHER PUBLICATIONS

Stuart Uram, CERTECH Incorporated, *Commercial Applications of Ceramic Cores*, 26th Annual Meeting of the Investment Casting Institute 1978, pp. 10:1–10:12.
Stuart Urama, CERTECH Incorporated, *Assembly of Ceramic Cores to Form Complex Passageways*, 29th Annual Meeting of the Investment Casting Institute, pp. 4a:01–4A:10.
Robert A. Horton, PCC Airfoils, Inc., *Investment Casting*, Molding and Casting Processes, pp. 253–269.

*Primary Examiner*—Donald P. Walsh
*Assistant Examiner*—J. N. Greaves
*Attorney, Agent, or Firm*—Cary W. Brooks

[57] ABSTRACT

Disclosed is a method of making moldless/coreless single crystal castings of NiAl($\beta'$) alloys. Drops of molten NiAl($\beta'$) alloy is deposited on a starter seed block of single crystal alloy and casting structures are epitaxially grown to predetermined configurations and shapes by repeatedly dropping and solidifying molten NiAl($\beta'$) materials.

5 Claims, 1 Drawing Sheet

MOLDLESS/CORELESS SINGLE CRYSTAL CASTINGS OF NICKEL-ALUMINIDE

FIELD OF THE INVENTION

This invention relates to nickel-aluminide castings using a drip process without the need for casting molds or cores. This invention applies to other high temperature, reactive alloys and situations where elimination of mold and/or cores is desirable.

BACKGROUND OF THE INVENTION

Various methods of producing single crystal castings are known. Generally, these methods require a temperature of about 400° F. temperature gradient above the melting point of the alloy to be grown in a single crystal structure. Such a temperature gradient is needed so that a section of the casting can be cooled below the melting point of the alloy and solidified slowly so that small layers build up duplicating and taking on the crystal structure of the previous solidified layer. Nickel-aluminide (NiAl) in a 50/50 atomic percent ratio would be a desirable alloy for a variety of structures including gas-turbine blades or components. However, NiAl($\beta'$), i.e., in a 50/50 atomic weight percent ratio, has a melting point of 2980° F. (about 1638° C.).

Unfortunately, commercially available ceramic casting mold shells and cores turn to glass at about 3000° F. In order to produce a single crystal structure using NiAl($\beta'$), the casting mold and cores would have to be able to withstand a temperature of about 3400° F. Thus, conventional methods of casting using molds and ceramic cores are not suitable for making a single crystal casting of NiAl($\beta'$).

Thus, it would be desirable to have a method of producing single crystal castings of NiAl($\beta'$).

SUMMARY OF THE INVENTION

Generally, the present invention includes single crystal structures of nickel-aluminide. The invention also includes a method of producing single crystal structures of NiAl($\beta'$) using a method including providing a starter block of single crystal material, directing a high power focused heat source on a NiAl($\beta'$) target so that the target melts and drips are deposited onto the single crystal starter block allowing the drip to cool and solidify in an epitaxial single crystal orientation.

The invention includes the discovery that a seed starter block of a different alloy having a single crystal structure may be utilized to produce single crystal NiAl($\beta'$) structures when molten NiAl($\beta'$) is deposited on the seed block.

These and other objects, features and advantages will be apparent from the following brief description of the drawings, detailed description and appended claims and drawings.

DETAILED DESCRIPTION OF THE INVENTION

Figure 1:
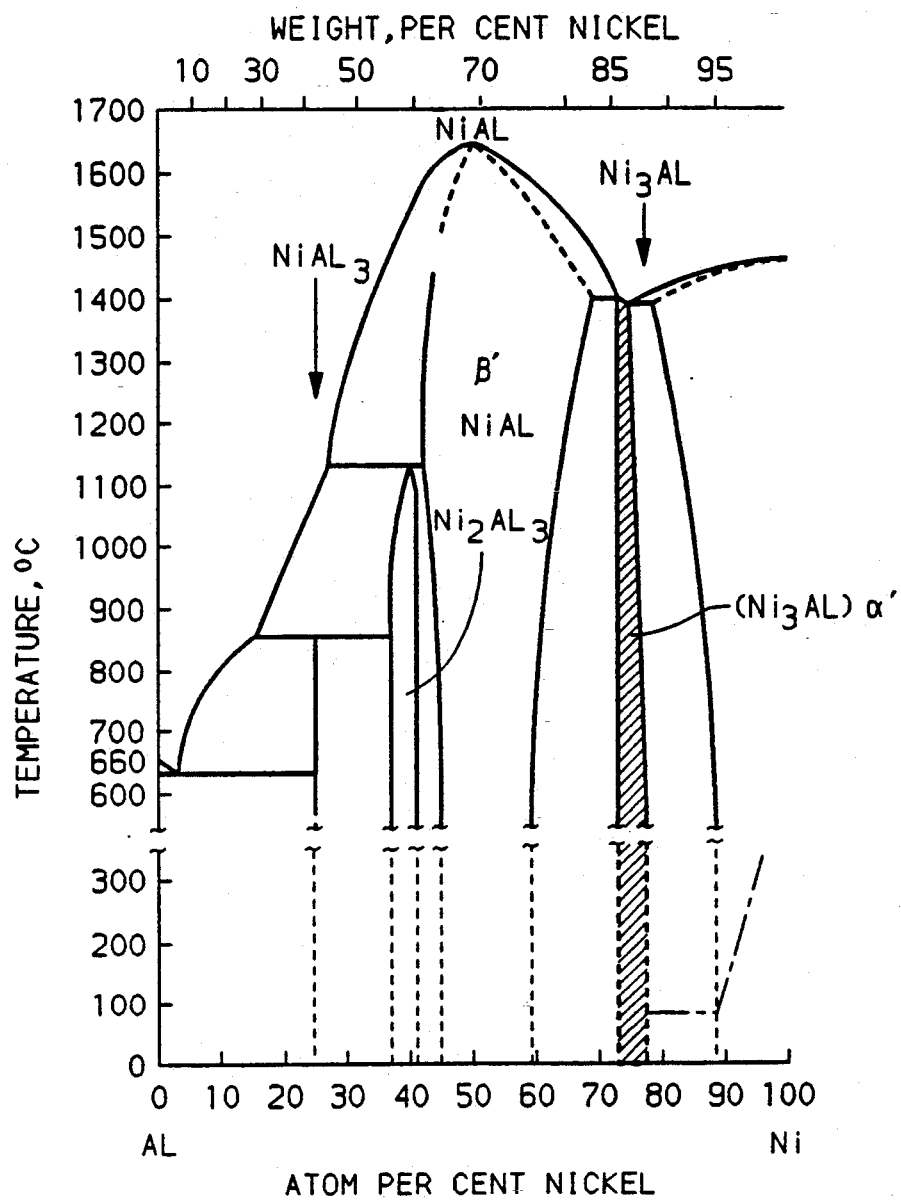
FIG. 1 is a graphical illustration of a phase diagram for nickel-aluminum alloys.

As illustrated in FIG. 1, NiAl($\beta'$) has a melting point of about 2980° F. (about 1638° C.). Thus, in order to produce a single crystal alloy of NiAl($\beta'$) using traditional techniques, the casting mold and core would have to be able to withstand a temperature of about 3400° F. Most state-of-the-art ceramic casting shell and core materials melt or turn to glass at about 3000° F. thus making it impossible to use traditional techniques for producing cast structures of NiAl($\beta'$).

Although various nickel-aluminum alloys have been used, NiAl($\beta'$) alloys have superior strength and an elevated melting temperature. For example, Ni$_3$Al and a commercially available alloy known as CMSX-4 are compared in Table I.

TABLE I

|  | CMSX-4 | Ni$_3$Al | NiAl($\beta'$) |
| --- | --- | --- | --- |
| Melt Point | 2425° F. | 2535° F. | 2980° F. |
| Density (lb/in$^3$) | .314 | .271 | .213 |
| Strength | 1 | .6 | 10 |
| Equiaxed Ductility | Nil | Nil | Nil |
| SX Ductility | 10% | 100% | 1% |

Where strength was measured in relative 1800° F. tensile strength units and Sx ductility means percent elongation.

According to the present invention, a NiAl($\beta'$) target is provided for example in the form of a wire. A high power focused heat source is directed onto the NiAl($\beta'$) target so as to melt the target. A suitable heat source includes a laser. A seed starter block is positioned beneath the target and is made from a single crystal alloy. A suitable alloy for the starter block includes one comprising duplicating the composition of the desired casting. The high power focused heat source is controlled so that drips of molten NiAl($\beta'$) are allowed to deposit on the starter block in a controlled fashion so that they may be cooled and take on an epitaxial single crystal formation. A pulse laser may be particularly suitable for this process. Preferably, the NiAl($\beta'$) target can be moved at a variety of directions during the process to build a structure of a desired shape. A suitable target moving means includes a computer aided design/computer aided manufacturing device (CAD/CAM) a robot capable of moving the target in at least X-Y and z directions. Preferably, the process is conducted in a vacuum system or inert atmosphere to prevent oxidation of the reactive alloys.

Figure 2:
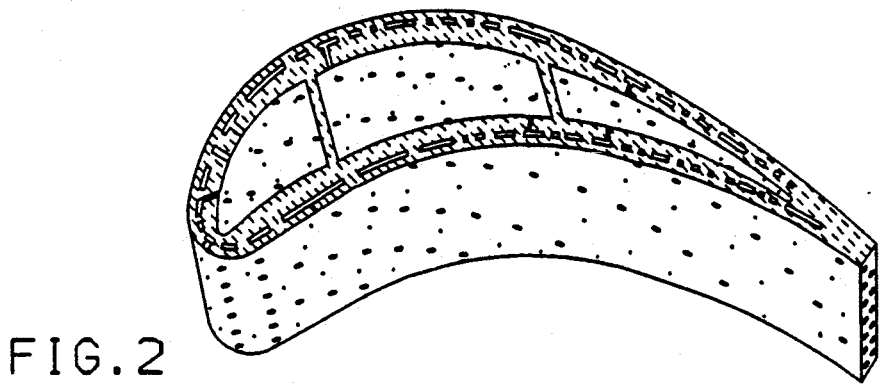
FIG. 2 is an illustration of a transpiration cooled airfoil of a single piece of NiAl($\beta'$) single crystal alloy according to the present invention.

The process of making single crystal NiAl($\beta'$) casting is contemplated for the manufacture of transpiration cooled gas-turbine blades as shown in FIG. 2. Such turbine blades have a very thin outer wall having a thickness ranging from about 0.010" to about 0.050" and preferably about 0.015". The blades have air source holes formed in the outer wall. An air passageway is formed between the thin outer wall and a thicker portion of the blade. The air passageway has a thickness ranging from about 0.005" to about 0.020" and most preferably about 0.007". Holes are provided between the air passageway through the thicker second wall to an inner hollow portion of the turbine blade. It is contemplated that the present invention can be utilized to produce a gas-turbine blade as illustrated in FIG. 2 which is a single piece of NiAl($\beta'$) single crystal structure.

The embodiments of the invention in which an exclusive property or privilege is claimed are defined as follows:

1. A method comprising:
   (a) providing a NiAl($\beta'$) target;
   (b) positioning a seed block of a single crystal alloy beneath said target;
   (c) causing a selective portion of said target to melt so that a drip of molten NiAl($\beta'$) is deposited on said block;
   (d) causing said drip of molten NiAl($\beta'$) to slowly solidify so as to have a single crystal orientation.
   (e) repeating steps (c)–(d) to cast a first layer of a single crystal NiAl($\beta'$) on the block,
   (f) causing a selective portion of said target to melt so that a drip of molten NiAl($\beta'$) is deposited on a previously formed layer of single crystal NiAl($\beta'$) and causing the drip of molten NiAl($\beta'$) to slowly solidity so as to have a single crystal orientation, and
   (g) repeating step (f) to build successive layer of single crystal NiAl($\beta'$) and to produce a product having a single crystal orientation of NiAl($\beta'$) throughout and of of predetermined configuration and shape.

2. A method as set forth in claim 1 further comprising the steps of selectively moving said target and sequentially causing drips of molten NiAl($\beta'$) to be deposited in various locations and solidified in single crystal orientation on said block or previously solidified NiAl($\beta'$) to epitaxially grow a single crystal structure in a predetermined configuration and shape.

3. A method as set forth in claim 1 wherein said step of causing said target to melt is accomplished by directing a laser beam onto said target.

4. A method as set forth in claim 1 wherein said target comprises a wire of NiAl($\beta'$) material.

5. A method as set forth in claim 1 wherein said target comprises NiAl($\beta'$) powder.

* * * * *